(12) United States Patent
McKay et al.

(10) Patent No.: US 7,696,572 B2
(45) Date of Patent: *Apr. 13, 2010

(54) SPLIT SOURCE RF MOSFET DEVICE

(75) Inventors: Thomas G. McKay, Felton, CA (US); Stephen Allott, Scotts Valley, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/210,725

(22) Filed: Aug. 25, 2005

(65) Prior Publication Data

US 2005/0280096 A1 Dec. 22, 2005

Related U.S. Application Data

(63) Continuation of application No. 10/101,405, filed on Mar. 18, 2002, now Pat. No. 7,015,545.

(51) Int. Cl.
*H01L 29/76* (2006.01)
*H01L 29/94* (2006.01)
*H01L 31/062* (2006.01)

(52) U.S. Cl. ............... 257/343; 257/341; 257/342; 257/E29.027

(58) Field of Classification Search ......... 257/341–434, 257/275, E29.027
See application file for complete search history.

(56) References Cited

U.S. PATENT DOCUMENTS

| 4,766,471 A | * | 8/1988 | Ovshinsky et al. ............ 257/53 |
| 5,900,663 A | | 5/1999 | Johnson et al. |
| 5,949,104 A | | 9/1999 | D'Anna et al. |
| 6,048,772 A | * | 4/2000 | D'Anna ...................... 438/301 |
| 6,359,316 B1 | | 3/2002 | Voss et al. |
| 6,429,723 B1 | | 8/2002 | Hastings |
| 6,627,507 B2 | | 9/2003 | Yuan |
| 7,015,545 B2 | * | 3/2006 | McKay et al. .............. 257/341 |

FOREIGN PATENT DOCUMENTS

JP 06232396 A * 8/1994

* cited by examiner

*Primary Examiner*—Shouxiang Hu
(74) *Attorney, Agent, or Firm*—Sterne, Kessler, Goldstein & Fox P.L.L.C.

(57) ABSTRACT

An RF MOS transistor having improved AC output conductance and AC output capacitance includes parallel interdigitated source and drain regions separated by channel regions and overlying gates. Grounded tap regions contacting an underlying well are placed contiguous to source regions and reduce distributed backgate resistance, lower backgate channel modulation, and lower output conductance.

23 Claims, 5 Drawing Sheets

SPLIT SOURCE RF MOSFET DEVICE

CROSS-REFERENCE TO RELATED APPLICATIONS

This application is a continuation of U.S. patent application Ser. No. 10/101,405, entitled "SPLIT SOURCE RF MOSFET DEVICE," filed Mar. 18, 2002, which is herein incorporated by reference in its entirety.

BACKGROUND OF THE INVENTION

The present invention is related to the design of MOS transistors and, in particular, to the design of MOS transistors operating in the RF frequency region.

Current semiconductor processing technologies have enabled the reduction of sizes of transistors with critical dimensions below 0.25 µm. Critical dimensions are now approaching 0.18 µm and even more aggressive technologies are considering critical dimensions of 0.13 µm. The operating frequencies of the resulting integrated circuits have risen to such an extent that MOS (Metal-Oxide-Semiconductor) integrated circuits are being used for RF (Radio Frequency) applications.

However, at high frequencies the transistors operate less efficiently in some applications. This is especially true when the MOS transistor is used in a receiving circuit, which is required to have high linearity and low-noise. The AC output conductance and the AC output capacitance of the transistor are adversely affected. The output conductance increases with frequency and the output capacitance becomes highly dependent upon the device's bias. An increase in output conductance results in reduced gain and bias dependency results in added distortion. Additionally, in a low-noise amplifier circuit, unintended and undesirable circuit feedback voltage may be induced from the back gate-to-source connection.

Therefore, an MOS transistor for RF operations in which the shortcomings above are solved or substantially alleviated is desirable. The present invention provides for such an MOS transistor, which is highly suitable for operation with RF circuits.

BRIEF SUMMARY OF THE INVENTION

The present invention provides for an RF MOS transistor having a plurality of elongated first source/drain regions, a plurality of elongated second source/drain regions that are parallel to and interdigitated with the elongated first source/drain regions in a semiconductor substrate, a plurality of elongated gate electrodes over the semiconductor substrate defining channel regions separating the elongated first source/drain regions from the elongated second source/drain regions; and a plurality of elongated tap regions in the semiconductor substrate parallel to and interdigitated with the elongated first and second source/drain regions. The elongated tap regions provide an electrical voltage reference for the channel regions and are arranged so that each elongated second source/drain region is abutted to an elongated tap region.

The present invention further provides for an integrated circuit having a circuit block having input and output terminals each having AC signals at an RF frequency and, at least, one RF MOS transistor connected to the circuit block. The RF MOS transistor has a plurality of drain regions elongated and parallel in the semiconductor substrate of the integrated circuit, a plurality of source regions elongated in the semiconductor substrate parallel to and interdigitated with the drain regions, a plurality of elongated gate electrodes over the semiconductor substrate defining channel regions separating the elongated drain regions from the elongated source regions, and a plurality of elongated tap regions in the semiconductor substrate that are parallel to and interdigitated with the elongated drain and source regions. Drain regions are connected to each other in parallel by a drain terminal that is coupled to a first power supply. The source regions are connected to each other in parallel by a source terminal that is coupled to an RF ground; the gate electrodes are connected to each other in parallel to a gate terminal that is connected to the circuit block input terminal. The tap regions are connected to the source regions locally. The tap regions provide an electrical voltage reference for the channel regions and are arranged so that each elongated source region is contiguous to an elongated tap region so that backgate modulation of the channel regions is reduced.

BRIEF DESCRIPTION OF THE DRAWINGS/FIGURES

FIG. 1A is a plan view for the layout of a conventional RF MOS transistor; FIG. 1B is a cross-sectional view of the RF MOS transistor of FIG. 1A; FIG. 1C is representation of a circuit schematic of the RF MOS transistor of FIG. 1A that shows the back-gate resistance between the well tap and the intrinsic transistor back-gate terminal;

Figure 4E:
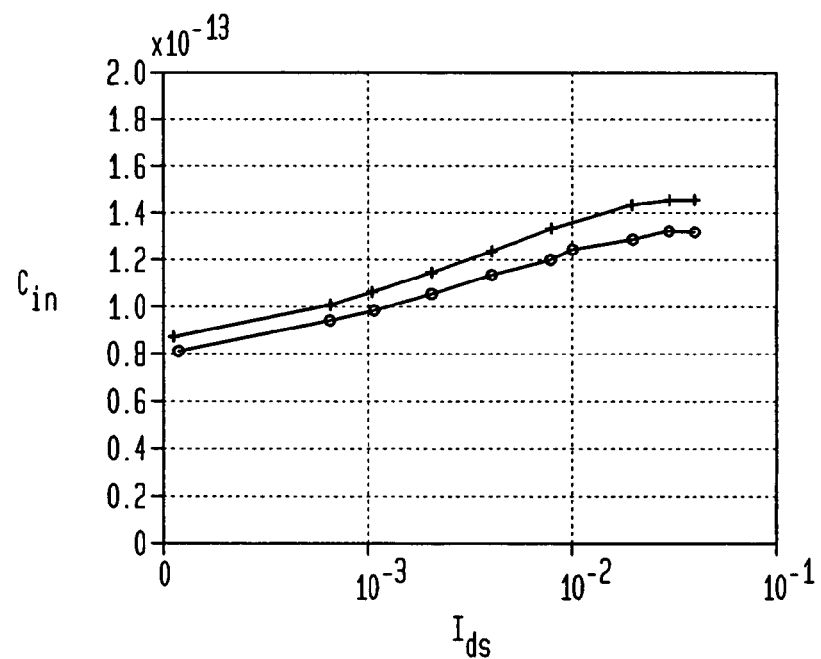
Figure 4A:
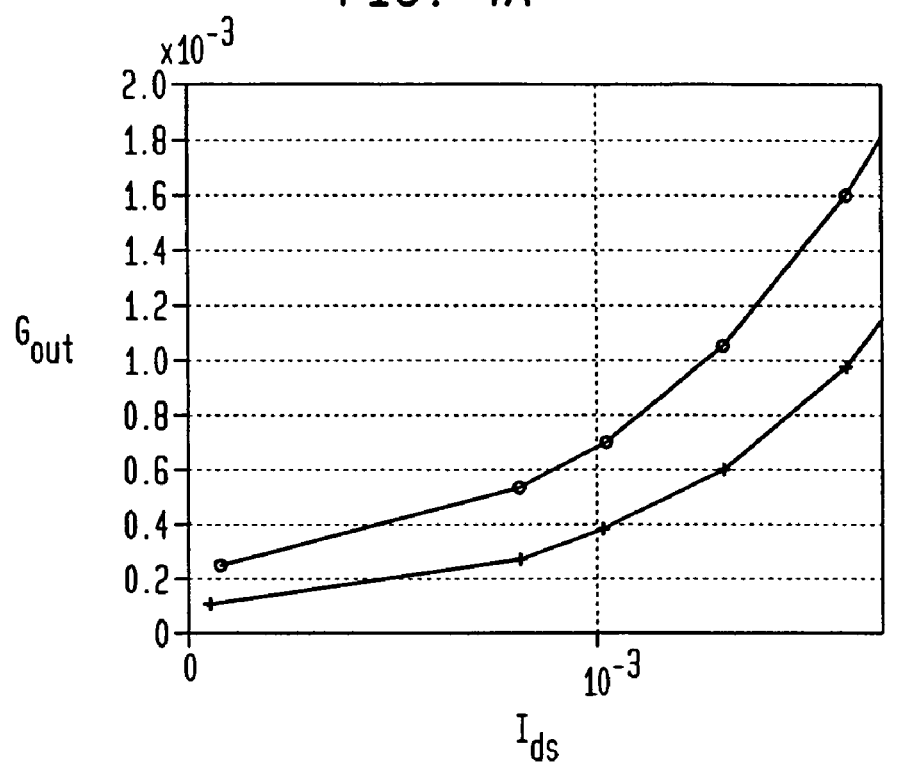
Figure 4B:
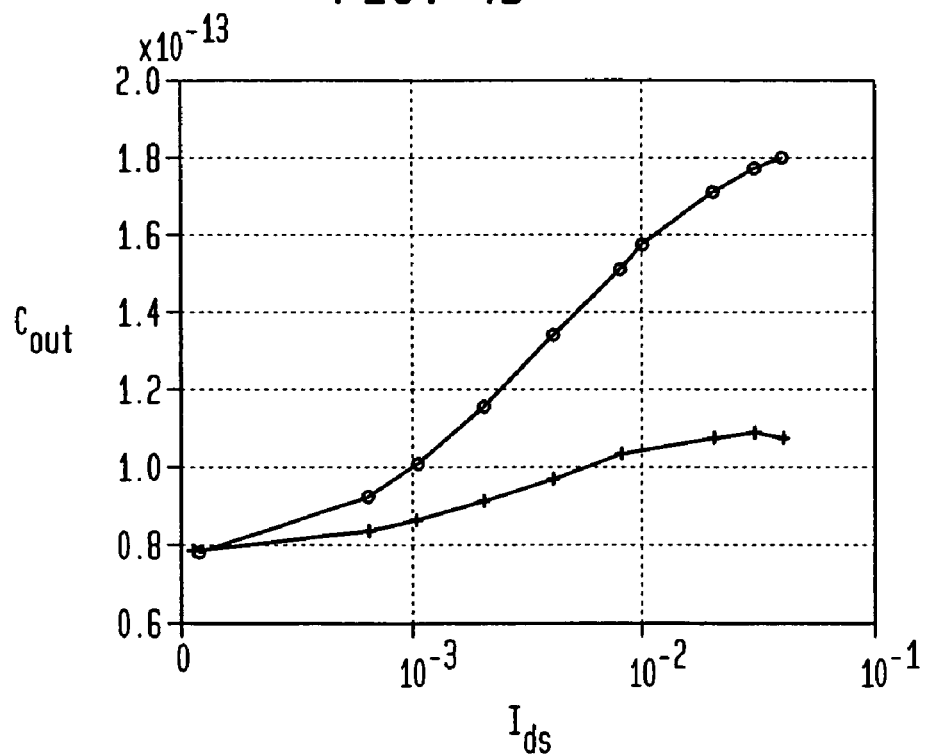
Figure 4C:
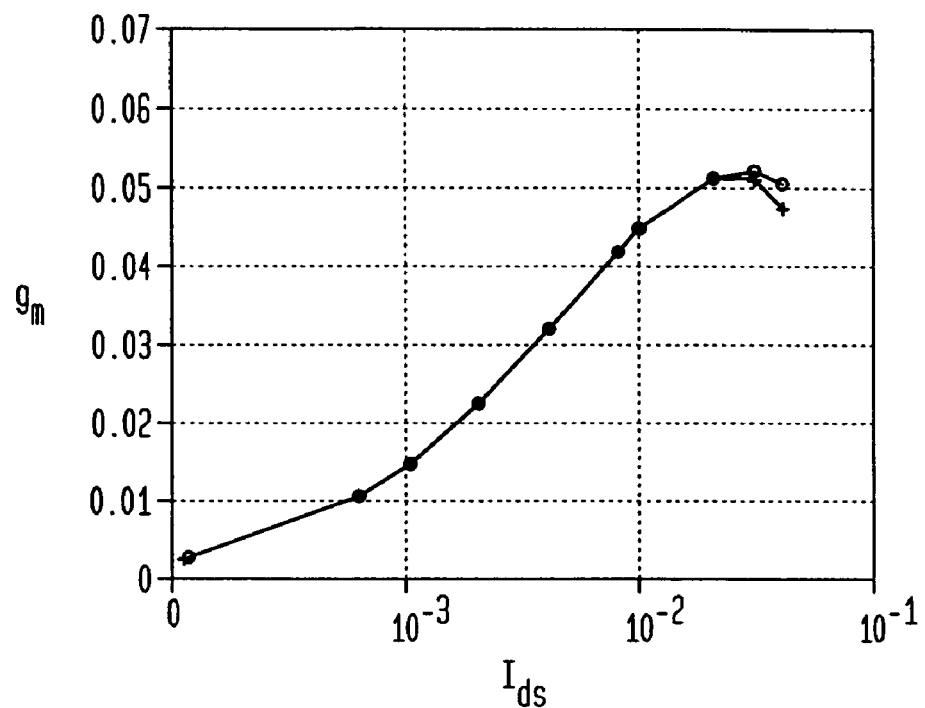
Figure 4D:
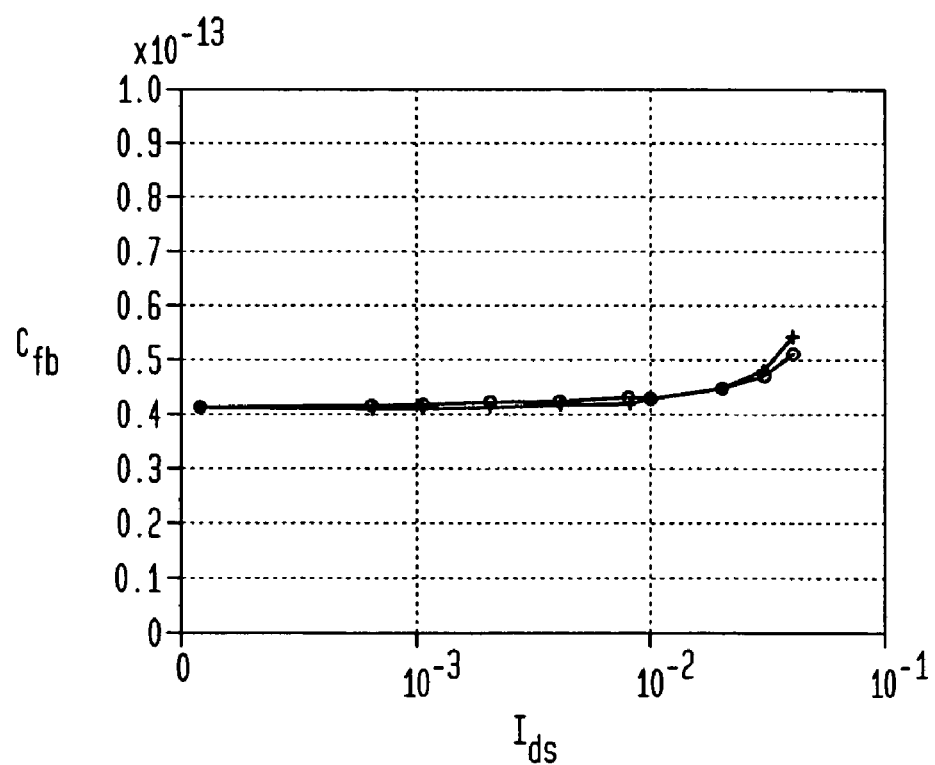

FIG. 4A is a comparison plot of measured data of AC output conductance versus the drain current $I_{ds}$ at a fixed drain-to-source voltage $V_{ds}$ for a conventional RF MOS transistor and an RF MOS transistor according to one embodiment of the present invention; FIG. 4B is a similar comparison plot of measured data of the output capacitance versus the drain current $I_{ds}$ at a fixed drain-to-source voltage $V_{ds}$; FIG. 4C is another comparison plot of measured data of the transconductance $g_m$ versus drain current $I_{ds}$ at a fixed drain-to-source voltage $V_{ds}$; FIG. 4D is still another comparison plot of the feedback capacitance $C_{fb}$, versus the drain current at a fixed drain-to-source voltage $V_{ds}$; and FIG. 4E is another comparison of input capacitance versus drain current.

DETAILED DESCRIPTION OF THE INVENTION

Figure 1A:
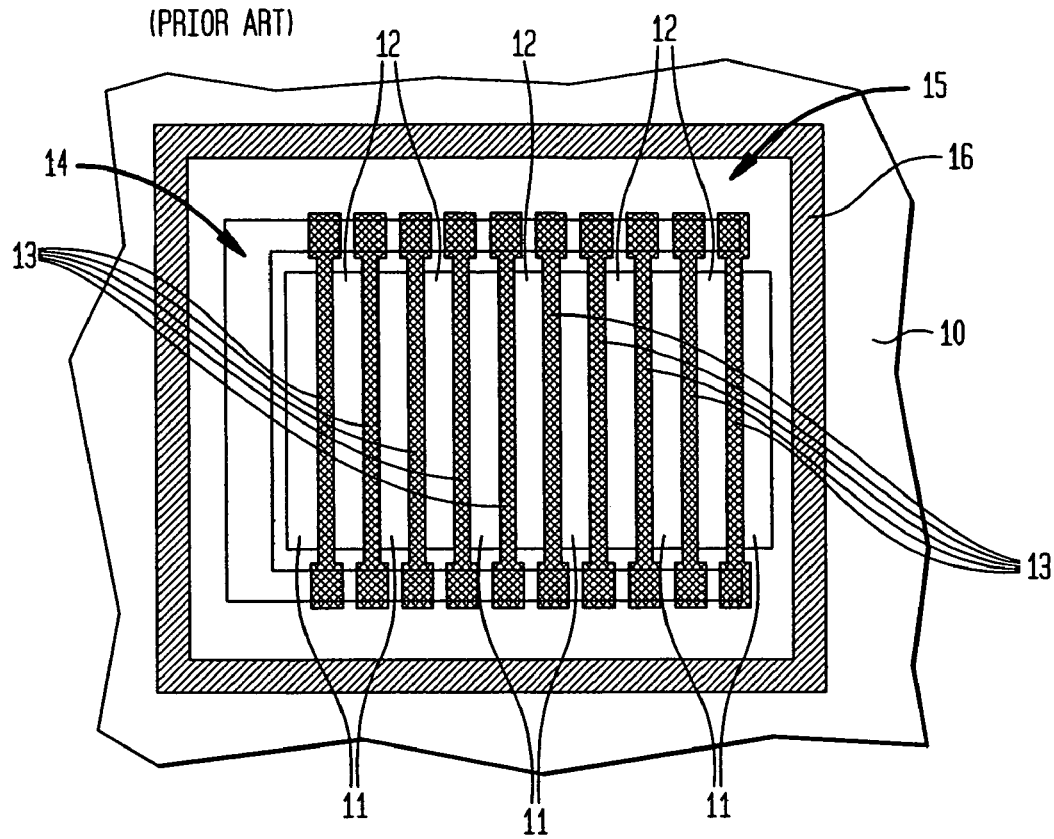
Figure 1B:
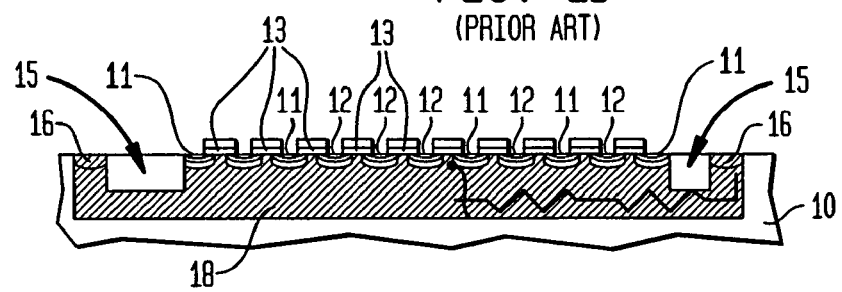

FIGS. 1A and 1B illustrate a conventional RF NMOS transistor in a semiconductor substrate 10. The transistor has a plurality of source regions 11 that are interdigitated with drain regions 12. The source and drain regions 11, 12 are formed by N+-type regions formed in a P-type well 18 in the substrate 10. Gate electrodes 13 lie over channel regions between the source and drain regions 11, 12 and are connected in parallel by a metal interconnect 14. The source and drain regions 11, 12 are likewise connected in parallel respectively. The interconnects for these parallel connections are not shown in the drawings. Isolating the source and drain regions 11, 12 is an insulating oxide layer 15 in a trench surrounding the regions 11, 12. A P+-type tap 16 rings the oxide layer 15 (and source and gate regions 11, 12) at the periphery of the transistor and provides an electrical contact to the P-well 18 in that the source and drain regions 11, 12 are located.

Figure 1C:
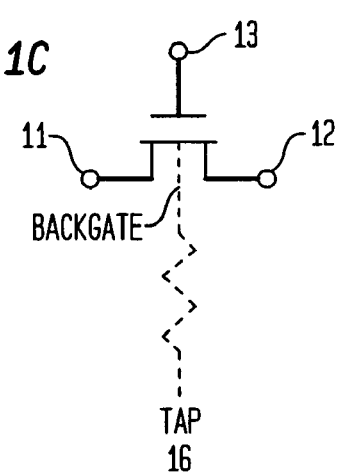

FIG. 1C is a circuit element symbol of the RF NMOS transistor of FIGS. 1A and 1B. For ease of understanding, the same reference numerals are used for the terminals of the NMOS transistor circuit symbol and for the corresponding parts of the transistor in FIGS. 1A and 1B. The circuit symbol is discussed in greater detail below.

Figure 2:
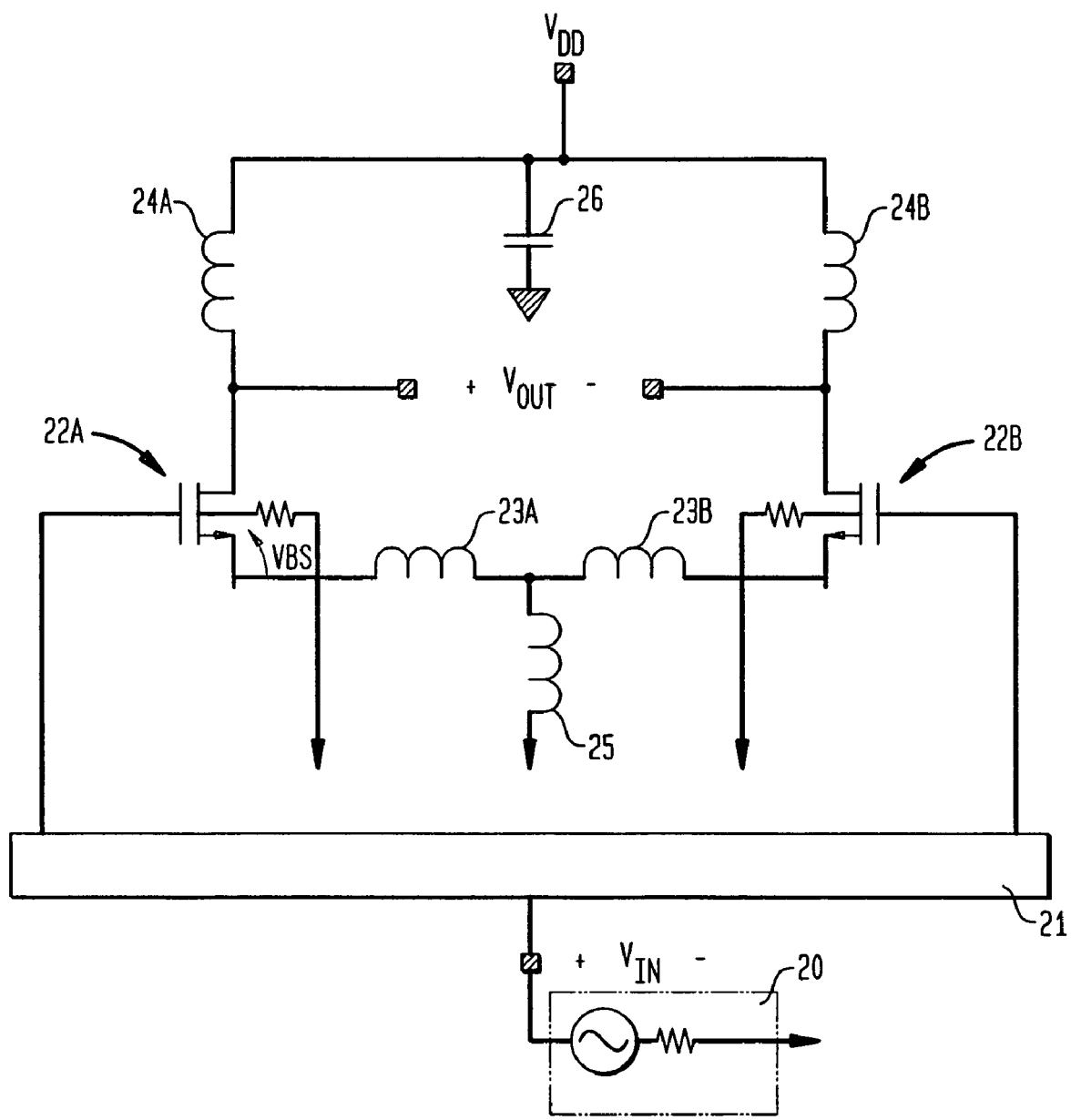
FIG. 2 is a block diagram of an exemplary RF circuit that uses RF MOS transistors.

A common application for RF MOS transistors is shown in FIG. 2. Low-Noise Amplifier circuits typically have a differential input pair with inductive series-series feedback inductors 23A and 23B, as shown in FIG. 2. An antenna 20, represented by a voltage source and a resistor is connected to a block 21 that represents an impedance-matching network and balun. The particular circuitry for the block 21 is well known to circuit designers and beyond the scope of the present invention. The output signal from the block 21 is an RF signal. In one particular application the signal has a frequency greater than 2 GHz and varies in amplitude from approximately 1 µV to 1V peak-to-peak. It should be understood that the DC component of the voltage, or bias voltage, on the terminals of the RF MOS transistors 22A and 22B exist but are not discussed in any detail since it is the RF signals, i.e., the AC components, that create the problems addressed by the present invention. The AC input signals are received by the gate electrodes of a differential pair of RF MOS transistors 22A and 22B, such as described with respect to FIGS. 1A and 1B. The source of the RF MOS transistors 22A, 22B are connected respectively to the inductors 23A and 23B, that are both connected to ground through a common inductor 25. The drains of the RF MOS transistors 22A, 22B are connected to the amplifier circuit output terminals, that are also connected to a positive supply voltage terminal at $V_{DD}$ through a matched pair of inductors 24A and 24B respectively. A capacitor 26 having a selected capacitance to tune the output circuit is also connected to the positive supply voltage terminal.

As shown, the backgates, or P-type well in which the transistor channel regions are located, of the RF NMOS transistors 22A and 22B are conventionally tied to ground. Such connections ensure that the threshold voltage $V_T$ of the transistors is fixed so that the transistors operate consistently with the input gate voltages $V_{gs}$. For example, in many RF applications of the MOS transistor, such as in the present exemplary application, the transconductance ($g_m=I_{ds}/V_{gs}$) from the AC gate voltage to the AC drain-source current is used. If the threshold voltage is allowed to move, then the signal voltage $V_{GS}$ does not accurately control the source-drain current, $I_D$, of the transistor.

Such a problem does arise in the conventional RF MOS transistors. For the RF signals, an undesirable voltage $V_{BS}$ appear between the backgate and the source of each transistor 22A and 22B, as represented in FIG. 1C by the resistor symbol. The $V_{BS}$ voltage appears due to the distributed resistance in the P-well 18 between the grounded tap 16 (See FIGS. 1B and 1C) and the channel region of the transistor. This backgate voltage $V_{BS}$ undesirably modulates the transistor's channel region and the source-drain current $I_D$ through the resistive back-gate terminal, as symbolically illustrated in FIGS. 1B and 1C. The unintended and undesired results are: 1) increased RF output conductance that lowers the gain (Gain~gm/$G_{out}$); 2) nonlinear output capacitance that increases the intermodulation distortion under high input signal conditions; 3) backgate modulation of the transistor channel region by the feedback network; and 4) susceptibility of the transistors to within-substrate interference at low frequencies and at RF from other elements of the integrated circuit.

Figure 3A:
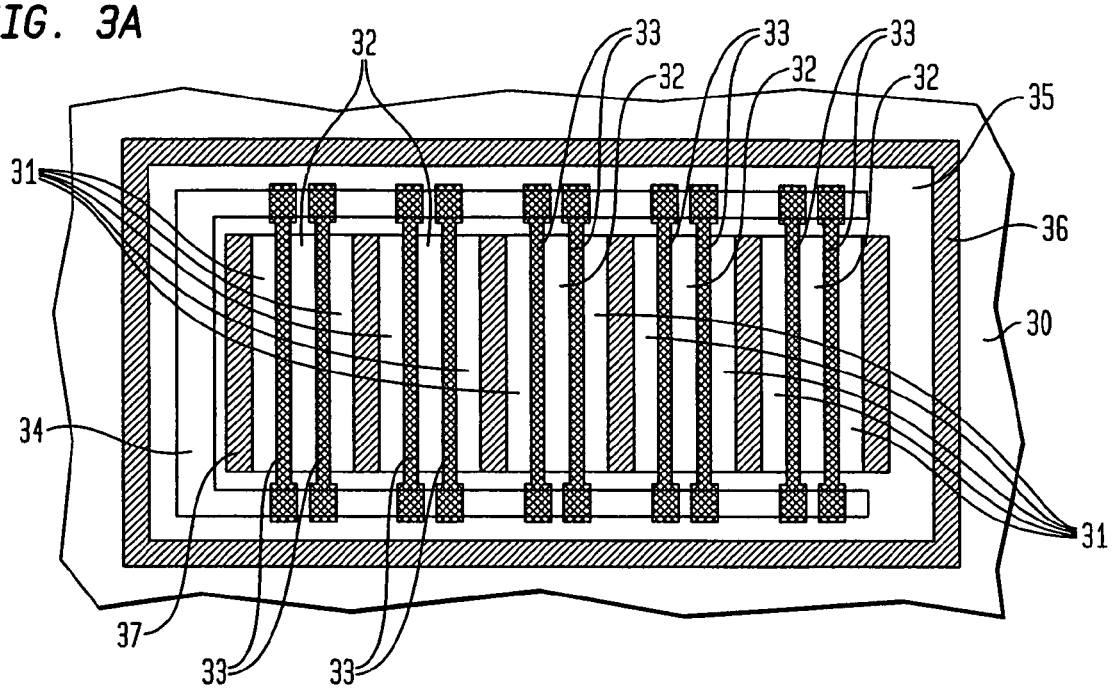
FIG. 3A is a plan view for the layout of an RF MOS transistor according to one embodiment of the present invention.
Figure 3B:
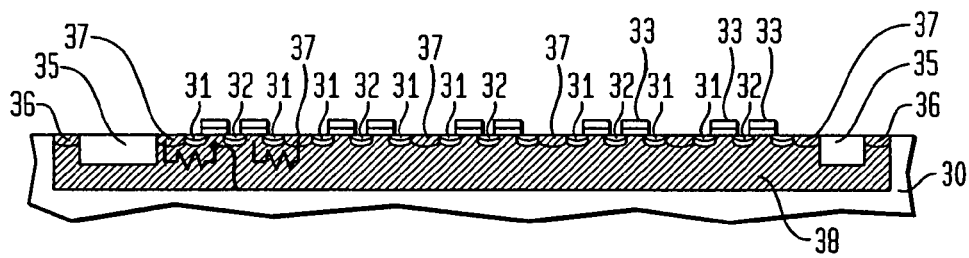
FIG. 3B is a cross-sectional view of the RF MOS transistor of FIG. 3A.

The present invention provides for an RF MOS transistor that avoids or substantially solves many of these problems. As shown in FIGS. 3A and 3B, the MOS transistor according to one embodiment of the present invention has its source regions 31 split into two parts and an active area tap 37 to the underlying P-well 38 is inserted between the source regions 31. The result is that each portion of the MOS transistor has a source region 31 on either side of a drain region 32 and gate electrodes 33 over the channel regions between the source and drain regions 31 and 32. As in the case of the conventional RF MOS transistor described previously, the different regions of the MOS transistor are all connected in parallel. The gate electrodes 33 are connected in parallel to a metal interconnect 34 and the source and drain regions 31 and 32 are respectively connected in parallel by metal interconnects (not shown). An isolating oxide layer 35 surrounds the source and drain regions 31, 32 and gate electrodes 33 in a shallow trench. Outside of and surrounding the oxide layer 35 is a grounded P+ tap 36 that contacts the P-well 38. The P-well 38 is also grounded by the active area taps 37.

Due to the close location of the taps 37 to the channel regions of the transistor, the distributed backgate resistance is lowered. When the MOS transistor is used in a common-source mode configuration, such as in an RF amplifier, this lowered resistance results in a lower backgate channel modulation. Additionally, the lowered resistance from the backgate channel region to common-source results in lower output conductance for the transistor. The lower output conductance creates a more ideal AC performance at radio and microwave frequencies for the MOS transistor.

Measured data illustrated in FIGS. 4A-4D show the marked performance improvement of the MOS transistor according to the present invention versus that of a conventional MOS transistor. A 0.18 µm process was used to manufacture both MOS transistors; operation is at radio frequencies.

FIG. 4A plots the AC output conductance versus the drain current $I_{ds}$ at a fixed drain-to-source voltage $V_{ds}=1V$ for a conventional MOS transistor (indicated by "o" data points) and the present invention's MOS transistor (indicated by "+" data points). The AC frequency is at 3 GHz. As shown, the present invention indicates an improved output conductance at 2 mA from 1.1 mS to 0.6 mS. This reduction in output conductance improves the gain of the MOS transistors at RF frequencies. FIG. 4B shows the output capacitance versus the drain current $I_{ds}$ at the fixed drain-to-source voltage $V_{ds}=1V$ for a conventional MOS transistor (indicated by "o" data points) and the present invention's MOS transistor (indicated by "+" data points). The AC frequency is at 3 GHz. With the present invention, the output capacitance variation with the drain current is significantly reduced from 225% to 38%. This more linear output capacitance with respect to $I_{ds}$ decreases the intermodulation distortion for high frequency input signals. FIG. 4C shows the transconductance $g_m$ versus drain current $I_{ds}$ at the fixed drain-to-source voltage $V_{ds}=1V$ for a conventional MOS transistor (indicated by "o" data points) and the present invention's MOS transistor (indicated by "+" data points). The AC frequency is at 3 GHz. As shown in the plot, the transconductance of both transistors are the same. Finally, FIG. 4D shows the feedback capacitance $C_{fb}$ versus the drain current at the fixed drain-to-source voltage $V_{ds}=1V$. Again, the conventional MOS transistor is indicated by "o" data points and the present invention's MOS transistor indicated by "+" data points. At 3 GHz frequency, the feedback capacitances of both transistors are the same.

It should be noted that with these improvements, i.e., a significantly lower output conductance and variation in output capacitance, and no difference in the transconductance and the feedback capacitance, the RF MOS transistor, according to the present invention, has a small undesired increase in input capacitance. As shown in FIG. 4E, $C_{in}$ is about 10% higher than that of the conventional MOS transistor at 3 GHz, which is the result of improving the reduction of the backgate resistance.

Nonetheless, with the MOS transistor of the present invention, a circuit that more nearly approaches an ideal Low-Noise Amplifier circuit is achieved. The undesirable modulation of the channel through the back-gate is nearly eliminated by reducing the backgate resistance and the susceptibility of the MOS transistors to interference at low and RF frequencies generated within the integrated circuit is greatly reduced.

Therefore, while the description above provides a full and complete disclosure of the preferred embodiments of the present invention, various modifications, alternate constructions, and equivalents will be obvious to those with skill in the art. For example, it should be evident that though the RF MOS transistors were described in terms of N-type MOS technology, P-type MOS technology could be used in certain circumstances. Thus, the scope of the present invention is limited solely by the metes and bounds of the appended claims.

What is claimed is:

1. A semiconductor device, comprising:
   a plurality of split source regions of a first conductivity type interdigitated with a plurality of drain regions in a well region of a semiconductor substrate, wherein each of the split source regions includes a first source region and a second source region, and wherein at least one of the drain regions is located adjacent to at least one from a group consisting of: the first source region, and the second source region;
   a plurality of active area taps of a second conductivity type different from the first conductivity type, a first active area tap from among the plurality of active area taps being in electrical contact with the well region, wherein the first active area tap is located between the first source region and the second source region;
   an isolating layer enclosing the plurality of split source regions, the plurality of active area taps and the plurality of drain regions, a second active area tap from among the plurality of active area taps being in contact with the isolating layer; and
   a plurality of gate electrodes, wherein at least one of the gate electrodes defines a channel region between at least one pair from a group consisting of:
   the first source region and the first drain region, and
   the second source region and the first drain region.

2. The semiconductor device of claim 1, wherein the well region includes a P-well region, and wherein at least one of the split source regions and the plurality of drain regions includes N+-type regions in the P-well region of the semiconductor substrate.

3. The semiconductor device of claim 2, further comprising:
   a third active area tap from among the plurality of active area taps in electrical contact with the P-well region.

4. The semiconductor device of claim 1, wherein the isolating layer includes an oxide layer.

5. The semiconductor device of claim 1, wherein the isolating layer is configured as a shallow trench.

6. The semiconductor device of claim 1, further comprising:
   a grounded tap enclosing the isolating layer, wherein the grounded tap is in electrical contact with the semiconductor substrate.

7. The semiconductor device of claim 6, wherein the well region includes a P-well region, and wherein the grounded tap includes a grounded P+-type ring in electrical contact with the P-well region of the semiconductor substrate.

8. The semiconductor device of claim 1, further comprising:
   a plurality of conductive interconnects to couple at least one from a group consisting of:
   each of the first source regions in parallel,
   each of the second source regions in parallel, and
   each of the drain regions in parallel.

9. The semiconductor device of claim 1, further comprising:
   a conductive interconnect to couple the plurality of gate electrodes in parallel.

10. The semiconductor device of clam 9, wherein the conductive interconnect includes a metal material.

11. The semiconductor device of claim 1, wherein the well region is formed entirely within the semiconductor substrate.

12. A semiconductor device, comprising:
    a well region formed in a semiconductor substrate;
    a plurality of split source regions of a first conductivity type formed in the well region interdigitated with a plurality of drain regions formed in the well region, wherein each of the split source regions include a first source region and a second source region, and wherein at least one of the drain regions is located adjacent to at least one from a group consisting of: the first source regions and the second source region;
    a plurality of active area taps of a second conductivity type, different from the first conductivity type formed in the well region, a first active area tap from among the plurality active area taps being in electrical contact with the well region, wherein the first active area tap is located between the first source region and the second source region;
    an isolating layer enclosing the plurality of split source regions, the plurality of active area taps and the plurality of drain regions, a second active area tap from among the plurality of active area taps being in contact with the isolating layer; and
    a plurality of gate electrodes, wherein at least one of the gate electrodes defines a channel region between at least one pair from a group consisting of:
    the first source region and the first drain region, and
    the second source region and the first drain region.

13. The semiconductor device of claim 12, wherein the plurality of split source regions and the plurality of drain regions are heavily implanted with an N-type material to form respective N+ regions and the well region is implanted with a P-type material to form a P-well.

14. The semiconductor device of claim 13, wherein the plurality of active area taps are in electrical contact with and ground the P-well.

15. The semiconductor device of claim 12, wherein the isolating layer is configured as a shallow trench.

16. The semiconductor device of claim 12, further comprising a grounded ring of the second conductivity type in electrical contact with the well region.

17. The semiconductor device of claim 12, further comprising:
    a plurality of conductive interconnects to couple at least one from a group consisting of:
    each of the first source regions in parallel,
    each of the second source regions in parallel, and
    each of the drain regions in parallel.

18. The semiconductor device of claim 12, further comprising:

a conductive interconnect to couple the plurality of gate electrodes in parallel.

19. The semiconductor device of clam 18, wherein the conductive interconnect includes a metal material.

20. The semiconductor device of claim 12, wherein the isolating layer includes an oxide layer.

21. The semiconductor device of claim 12, further comprising:
a grounded tap enclosing the isolating layer, wherein the grounded tap is in electrical contact with the semiconductor substrate.

22. The semiconductor device of claim 21, wherein the grounded tap includes a grounded P+-type ring in electrical contact with the well region of the semiconductor substrate, wherein the well region is a p-well.

23. The semiconductor device of claim 12, wherein the well region is formed entirely within the semiconductor substrate.

* * * * *